United States Patent [19]
Wu et al.

[11] Patent Number: 5,329,192
[45] Date of Patent: Jul. 12, 1994

[54] HIGH SPEED CMOS CURRENT SWITCHING CIRCUIT

[75] Inventors: Tien-Yu Wu, Hsin-Chu; Yung-Peng Hwung, Taipei, both of Taiwan

[73] Assignee: Industrial Technology Research Institute, Hsinchu, Taiwan

[21] Appl. No.: 23,169

[22] Filed: Feb. 25, 1993

Related U.S. Application Data

[63] Continuation of Ser. No. 642,970, Jan. 17, 1991.

[51] Int. Cl.$^5$ .................. H03K 17/687; H03K 5/153
[52] U.S. Cl. .................................. 307/576; 307/350
[58] Field of Search ............... 307/576, 350, 351, 352, 307/353, 354, 355

[56] References Cited

U.S. PATENT DOCUMENTS

| | | | |
|---|---|---|---|
| 4,694,203 | 9/1987 | Uragami et al. | 307/270 |
| 4,721,866 | 1/1988 | Chi et al. | 307/270 |
| 4,818,893 | 4/1989 | Domnitz | 307/270 |

Primary Examiner—Curtis Kuntz
Assistant Examiner—Sinh Tran
Attorney, Agent, or Firm—Darby & Darby

[57] ABSTRACT

A CMOS current steering switch, especially well-suited for use in high speed switching circuits, has a differential switch transistor pair connected to a node, to which a current source is also connected. The gates of the switch transistor pair are controlled by a pair of buffers. The buffers are designed to avoid both switch transistors being off at the same time by decreasing the switching response time on one transistor of the signal compared to the opposite transistor.

2 Claims, 4 Drawing Sheets

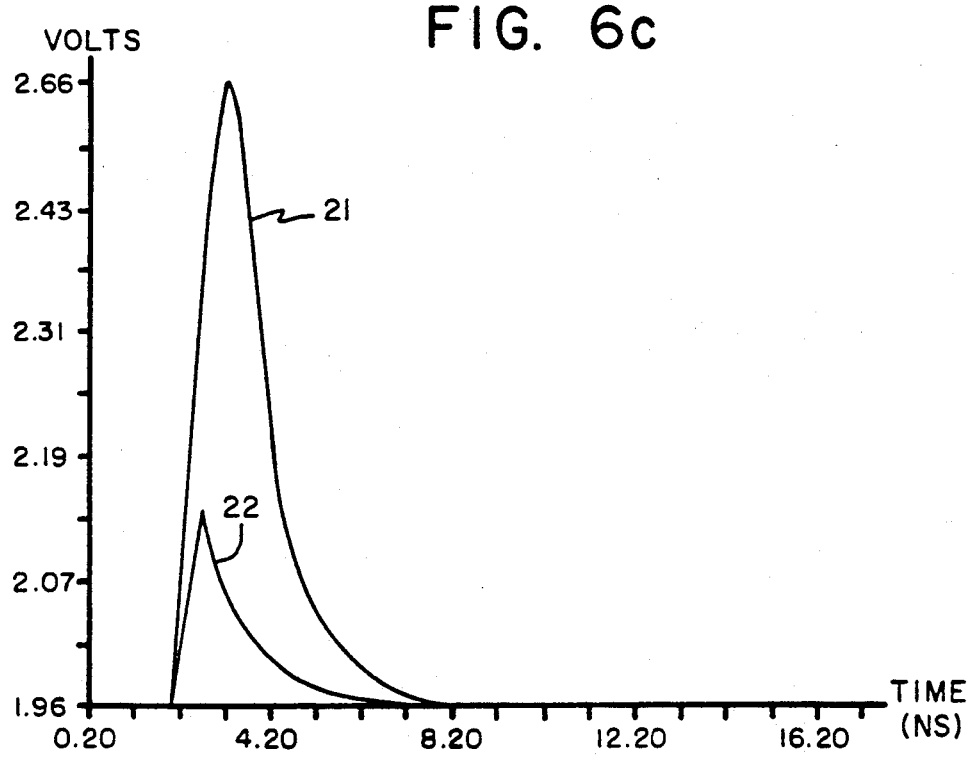
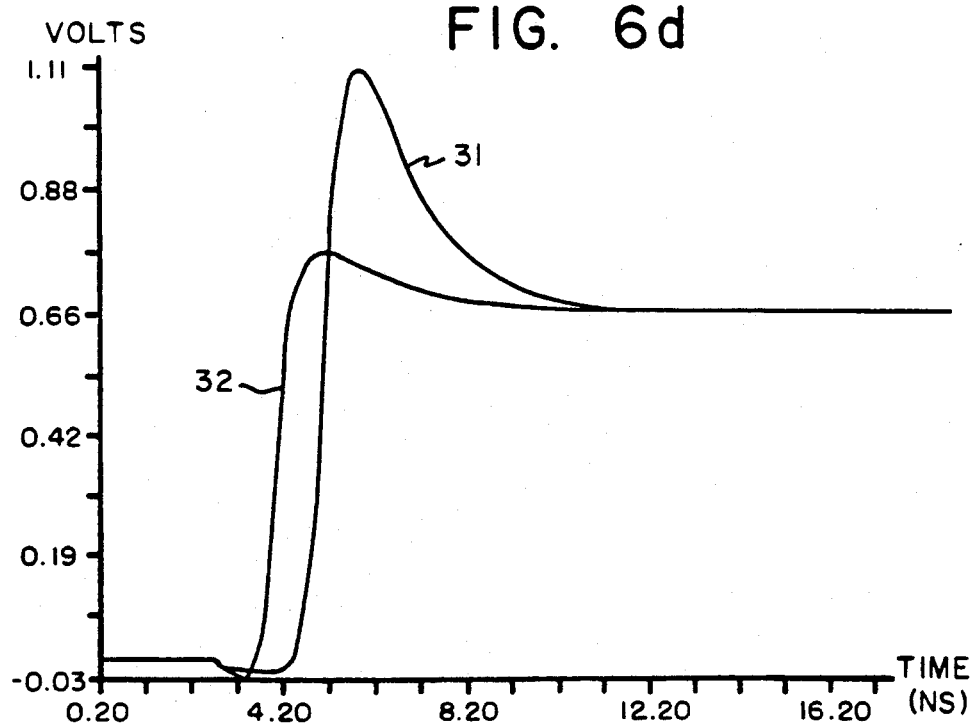

HIGH SPEED CMOS CURRENT SWITCHING CIRCUIT

This is a continuation of application Ser. No. 7/642,970, filed Jan. 17, 1991.

FIELD OF THE INVENTION

The present invention relates generally to switching circuits connected in complementary metal-oxide-semiconductor (CMOS) insulated gate field effect transistor circuits and, more particularly, concerns current steering CMOS switching circuits.

BACKGROUND OF THE INVENTION

Various switching circuits have been devised for a number of years to achieve the purpose of high speed switching.

For example, emitter-coupled logic (ECL) switching circuits comprise a pair of differential bipolar transistors. the emitters of the two transistors are joined together and are biased by a constant current source which is usually implemented with a transistor circuit. The bases of the differential pair of transistors receive, and are controlled by, differential inputs signals.

Although ECL circuits can operate at very high speed, they use bipolar transistor technology, which is more expensive to implement than the metal-oxide semiconductor (MOS) technology used in many digital integrated circuits. In addition, bipolar circuits dissipate more power than MOS circuits do.

Recently, some MOS switching circuits comprising a source-coupled transistor pair have been published which are similar to the ECL switching circuits.

When a source-coupled MOS transistor pair is used as a differential switch, the current conversion speed is limited by the switching time of the differential switch. Turning the switching MOS transistors on or off requires currents to flow into or out of the internal parasitic capacitances in both transistors, so that it takes more time to perform the switching operation than with an ECL switch. Hence the voltage fluctuation across the parasitic capacitances in both MOS transistors must be kept as small as possible.

In U.S. Pat. No. 4,721,866, Chi et al. disclose that two buffers be used for limiting the voltage swings, to ensure that the switching transistors are not both in the off state at the same time. Each buffer further includes a load transistor to reduce the voltage swing of the control signals. The load transistor is connected as a diode. According to this implementation, the voltage of the control signal can be reduced only by the threshold voltage $V_{th}$ of the load transistor. It is quite difficult to obtain the optimum operating point to acquire the minimum fluctuation in both transistors with such a switching circuit.

It is an object of this invention to provide a CMOS current steering switching circuit that can decrease the switching response time to the differential input control signals.

The circuit diagram of a current steering switch with a constant current source is shown in FIG. 1. Two p-channel transistors constitute a source-coupled differential pair, to the source coupling node of which a constant current source is connected. The drain terminals of the source-coupled transistors comprise the output terminals of the switching circuit. The current source is switched toward one of the two output lines depending on the control signals received by the gate terminals of the differential pair. The current source comprises two p-channel transistors connected in series, the gate terminals of which are biased by two selected voltages to provide a constant current.

For exact operation of the circuit, it is necessary to avoid simultaneous turn-off of the differential switching transistors. This is because if both switch transistors are off, the output node of the current source is rapidly discharged so that the current source comes into the nonsaturation region of operation. The following recharging slows the operation of the circuit. In other words, the voltage fluctuation range of the source coupling node of the differential pair must be kept as small as possible to achieve fast response.

According to the phenomenon mentioned above, the gate signals which control the switch transistor pair should be carefully designed to ensure that the switch transistors are not both off.

BRIEF DESCRIPTION OF THE DRAWINGS

FIGS. 6a through 6d show the simulation results for the prior art and the present invention.

DETAILED DESCRIPTION OF THE PREFERRED EMBODIMENT OF THE INVENTION

Figure 1:
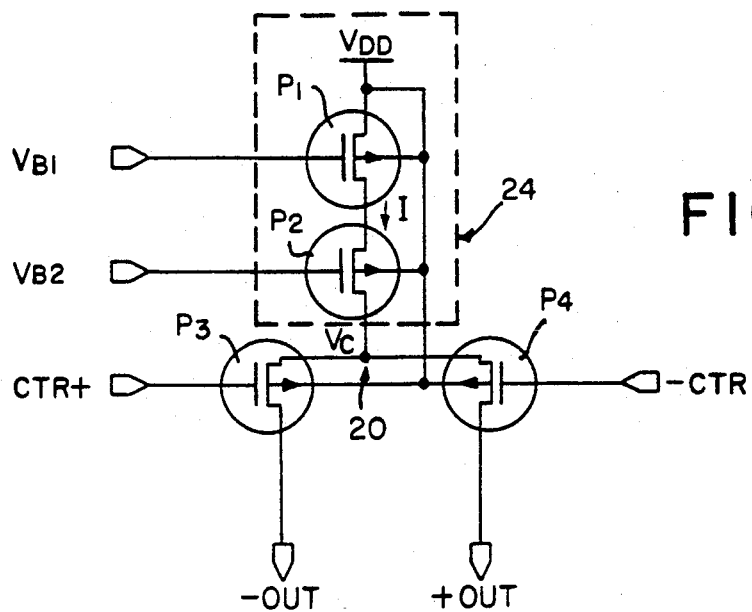
FIG. 1 is a schematic circuit diagram of the MOS current steering switch with a constant current source.

Referring to the schematic diagram of FIG. 1, a switching circuit includes a PMOS source-coupled transistor pair $P_3$ and $P_4$ having their source terminals connected to a node 20. The drain terminals of $P_3$ and $P_4$ are connected to the output terminals of the switching circuit, −out and +out, respectively. A current source comprises P-channel transistors $P_1$ and $P_2$ in series which are biased by selected voltages $V_{B1}$ and $V_{B2}$ respectively. The gate of $P_3$ receives and is controlled by a control signal CTR+. The gate of $P_4$ receives and is controlled by a control signal CTR−. The source of $P_1$ is connected to $V_{DD}$, the supply voltage. The drain of $P_1$ is connected to the source of $P_2$. The drain of $P_2$ and node 20 are connected together.

Figure 2:
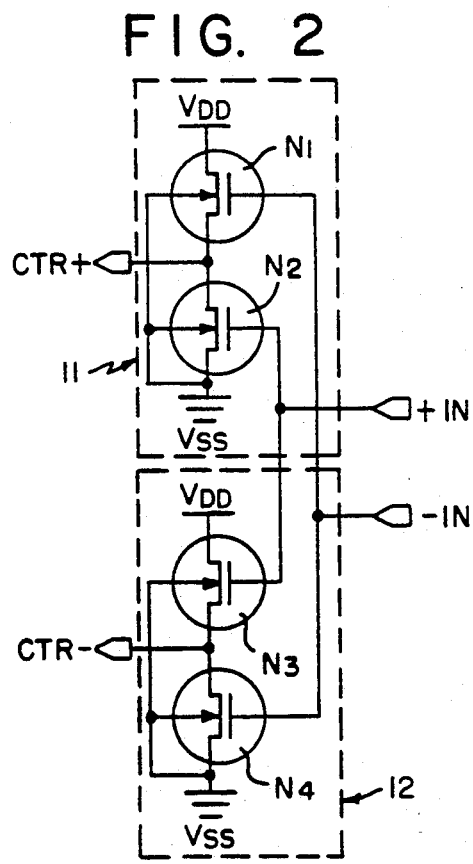
FIG. 2 is a schematic diagram of a buffer circuit of the level shift type in accordance with this invention.
Figure 3:
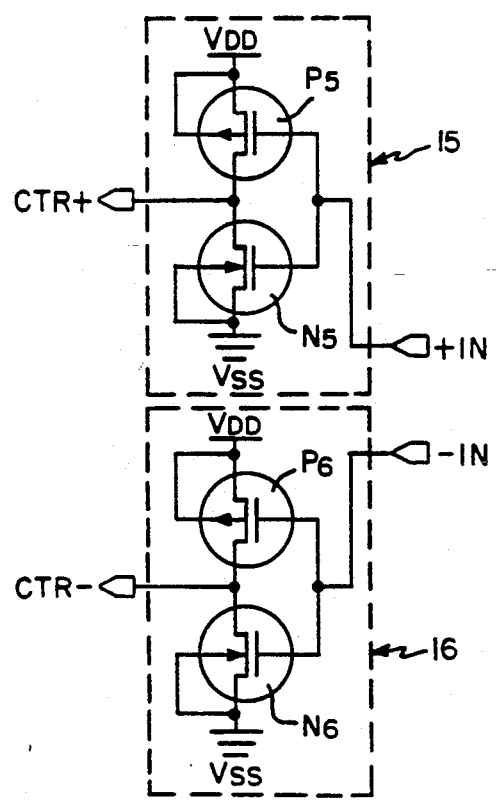
FIG. 3 is a schematic diagram of a buffer circuit of the inverter type in accordance with this invention.

The control signals CTR+ and CTR−, which respectively control the gate terminals of transistors $P_3$ and $P_4$ are the outputs of the buffer circuit shown in FIG. 2 or FIG. 3.

FIG. 2 shows a pair of level shift type buffers. FIG. 3 shows two inverter type buffers. Both types of buffer circuits have the same function.

The buffer circuit shown in FIG. 2 includes two buffers denoted 11 and 12, respectively. Buffer 11 includes two N-channel transistors $N_1$ and $N_2$. The input signal +IN is applied to the gate of the transistor $N_1$, the drain of which is connected to $V_{DD}$. The input signal −IN is applied to the gate of transistor $N_2$, the source of which is connected to ground. The buffer output signal CTR+ is taken from the node at which the source of $N_1$ and the drain of $N_2$ are connected together.

The buffer 12 contains two transistors $N_2$ and $N_4$. The drain of $N_3$ is connected to $V_{DD}$. The source of $N_4$ is connected to ground. The source of $N_3$ and the drain of $N_3$ are connected together and the output signal CTR– is taken from this connecting point. The input signal +IN is applied to the gates of $N_1$ and $N_4$ and the input signal –IN is applied to the gates of $N_2$ and $N_3$.

The inverter type buffer shown in FIG. 3 has a construction similar to the level shift type. The main difference between the two versions is that N-channel transistors $N_1$ and $N_3$ of FIG. 2 are replaced by P-channel transistors $P_5$ and $P_6$, respectively in FIG. 3. Buffer 15 then includes an N-channel transistor $N_5$ and a P-channel transistor $P_5$. The input signal +IN is applied to the gate terminals of transistors $N_5$ and $P_5$. Buffer 16 includes a P-channel transistor $P_6$ and a N-channel transistor $N_6$, and the input signal –IN is applied to the gate terminals of transistors $P_6$ and $N_6$.

The circuit shown in FIG. 1 operates as follows:

The signals CTR+ and CTR– control the switch transistor pair $P_3$ and $P_4$, respectively. When the CTR+ signal is at the low voltage level, the transistor $P_3$ is ON. At the same time, the other control signal CTR– is at the high voltage level. The transistor $P_4$ is OFF. The current provided by the current source flows from $P_3$ to output terminal –out. No current flows through $P_4$ to the output terminal +out.

On the other hand, when the CTR– signal is at the low voltage level, and the CTR+ signal is set at the high voltage level. The transistor $P_4$ is ON and transistor $P_3$ is OFF. The current I flows through $P_4$ to the output terminal +out, and no current flows to the other output terminal –out.

The buffers shown in FIG. 2 and FIG. 3 provide the control signals CTR+ and CTR– to the switch transistors. The complementary signals +IN and –IN are the input signals of the buffers. In FIG. 2, the CTR+ signal is a high level which occurs when the +IN signal is at a high voltage level and the –IN signal at a low voltage level. The other output signal CTR– is at a low level while CTR+ is a high level. On the other hand, the CTR+ signal is at a low level when the +IN signal is at a low voltage level and the –IN signal at a high voltage level, and the CTR– signal is at a high level at the same time.

Figure 4:
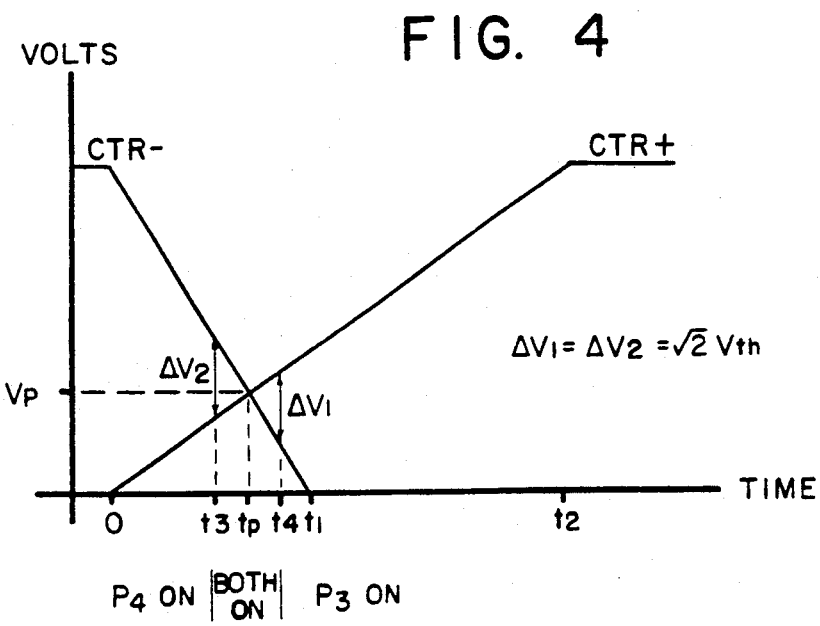
FIG. 4 is an output control signal waveform diagram of a buffer circuit as illustrated FIG. 2 or FIG. 3.

The voltage output of the buffer circuit is shown in FIG. 4. The output signal CTR+, CTR– both have the short fall time ($T_f$) and long rise time ($T_r$). The crossing point voltage ($V_p$) of the output signals CTR+ and CTR– is set at a quite low voltage level to ensure that the transistors $P_3$ and $P_4$ will not be turned off simultaneously and the voltage fluctuation range at node 20 will be minimized at the same time.

The buffer circuit illustrated in FIG. 2 operates as follows:

As an initial condition, –IN is set at low voltage level (zero volts) and +IN is set at five volts. The output CTR+ is at high level and the other output CTR– is a low level. The transistor $P_3$ is OFF and $P_4$ is ON. The constant current from current source 24 flows to +out. When –IN is changed from zero to five volts, CTR+ is changed from high level to low level. The CTR– is going to change from a low level to a high level. Because the fall time $T_f$ is quite fast and the rise time $T_r$ is so slow, the transistor $P_3$ is ON before transistor $P_4$ turns OFF, so that the two transistors $P_3$ and $P_4$ of the switching circuit are both ON for a while. When CTR– approaches a certain high level, the voltage level at node 20 is above zero but somewhat less than five volts so that the voltage level of the CTR– signal is sufficient to cut off the transistor $P_4$ and current from current source 24 passes through the output terminal –out.

In contrast, as +IN rises from zero to five volts, and –IN changes from five volts to zero volt, the transistor $N_1$ is ON, and the transistor $N_2$ is OFF, so that the output signal CTR+ approaches ($V_{DD}-V_{th}$), and the transistor $N_3$ is OFF, while the transistor $N_4$ is ON. The output signal CTR– of the circuit 12 approaches zero and the transistor $P_4$ is turned ON. The current from current source 24 flows through $P_4$ to the output terminal +out.

While designing the buffers, the optimum crossing point $V_P$ should be set by way of careful adjustment of the rise time $T_r$ and the fall time $T_f$, in order to minimize the fluctuation range at node 20 of the switching circuit. This provides the circuit shown in FIG. 1 with very fast switching times. Since parasitic capacitance is present in a transistor, it is necessary to minimize the charging and recharging operation.

The method of adjusting rise time ($T_r$) and fall time ($T_r$) is described hereinafter.

Figure 5:
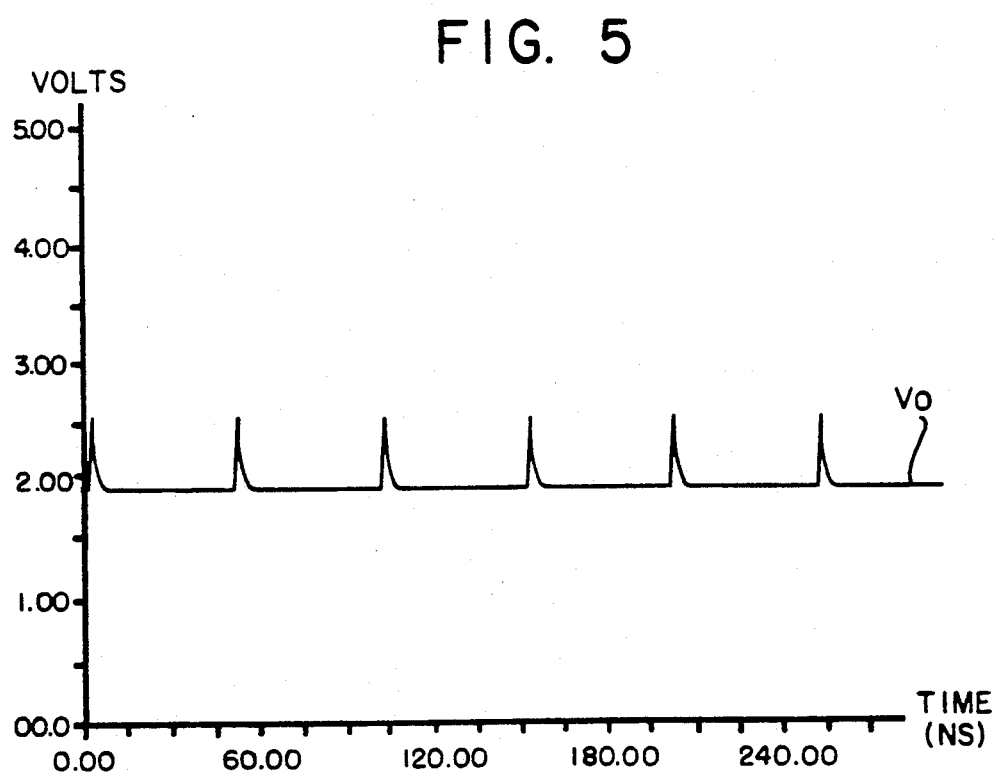
FIG. 5 is the voltage vs. time diagram of the source-coupling node of the current switching circuit.

In order to keep constant the current I flowing through current source 24, the variation of voltage $V_c$ at node 20 should be minimized. To derive the approximate expression for the current I, we assume that CTR+ is zero and CTR– equals $V_{DD}$ in the initial state. The voltage vs. time diagram of CTR+ and CTR– is illustrated in FIG. 4. Assuming that the value of $V_c$ is $V_O$ when CTR+ is zero and CTR– equals $V_{DD}$, we can see the value of $V_c$ might vary as the curve in FIG. 5. At t=0, the approximate expression for the current I can be given as $$I = K_{P3}(V_c - CTR+ - V_{th})^2 = K_{P3}(V_O - V_{th})^2 \quad (1)$$

where transistor $P_3$ is on and $P_4$ is off. At $T=t_P$, $P_3$ and $P_4$ are turned on simultaneously and the current can be written as $$I = K_{P3}(V_c - V_P - V_{th})^2 + K_{P4}(V_c - V_P - V_{th})^2 = 2K_{P3}(V_O - V_P - V_{th})^2 \quad (2)$$

wherein equivalent values of $K_{P3}$ and $K_{P4}$ are assumed. From equations (1) and (2), the crossing point $V_P$ of curve CTR+ and CTR– can be expressed as $$V_P = \frac{\sqrt{2}-1}{\sqrt{2}}(V_0 - V_{th}) \quad (3)$$

Therefore, the optimization of $V_P$ should be considered in the adjustment of rise time ($T_r$) and fall time ($T_f$).

Next, the adjustment considerations regarding rise time and fall time will be described. According to FIG. 4, the slope of CTR– curve can be expressed as $$CTR- = V_{DD} - \frac{tV_{DD}}{t_1} \quad (4)$$

and $$CTR+ = \frac{tV_{DD}}{t_2} \quad (5)$$

From FIGS. 1 and 4, if transistor P₃ is required just to turn on while P₄ is just turned off at t=t₃, then $$CTR_- - CTR_+ = \sqrt{2}\, V_{th} \tag{6}$$

In the same situation, if transistor P₄ is required just to turn on while P₃ is just turned off at t=t₄, then $$CTR_+ - CTR_- = \sqrt{2}\, V_{th} \tag{7}$$

From equations (4), (5), (6), and (7), we can get $$t_3 = \frac{V_{DD} - \sqrt{2}\, V_{th}}{V_{DD}} \cdot \frac{t_1 + t_2}{t_1 t_2} \tag{8}$$

and $$t_4 = \frac{V_{DD} + \sqrt{2}\, V_{th}}{V_{DD}} \cdot \frac{t_1 + t_2}{t_1 t_2} \tag{9}$$

Thus, $V_c$ is a function of t, $t_1$ and $t_2$. From now on $V_c$ will therefore be expressed as $V_c(t, t_1, t_2)$. Because $V_c(t, t_1, t_2)$ varies during different time periods, we can specify it in the following manner.

If $t \leq 0$ $$V_c = V_0 \tag{10}$$

which is as in the previous discussion.

If $0 < t < t_3$ $$I = K(V_c - CTR_+ - V_{th})^2 \tag{11}$$

so, $$V_c(t, t_1, t_2) = \sqrt{(I/K)} + CTR_+ + V_{th} \tag{12}$$

If $t_3 < t < t_4$, $$I = K(V_c - CTR_- - V_{th})^2 + K(V_c - CTR_+ - V_{th})^2$$

so $$V_c(t, t_1, t_2) = \tag{13}$$

$$\frac{CTR_- + CTR_+ + \sqrt{2C - (CTR_- - CTR_+)^2}}{2} + V_{th}$$

where $C = \frac{I}{K}$.

If $t_4 < t < t_2$, $$I = K(V_c - CTR_- - V_{th})^2$$

so, $$V_c = \sqrt{(I/K)} + CTR_- + V_{th} \tag{14}$$

$$\text{Define } P = \int_0^{t_2} [V_c - V_0]^2\, dt \tag{15}$$

$$= \int_0^{t_3} [V_c - V_0]^2\, dt + \int_{t_3}^{t_4} [V_c - V_0]^2\, dt +$$

$$\int_{t_4}^{t_2} [V_c - V_0]^2\, dt$$

From equations (4), (5), (12), (13), (14), and (15), P turns out to be a function of $t_1$ and $t_2$, and it can be expressed as $P(t_1, t_2)$. Here $t_1$ and $t_2$ have something to do with rise time and fall time. From FIG. 5, we know that if we want to minimize the variation of $V_c$, we should reduce $P(t_1, t_2)$, which means the next two equations should be considered in the adjustment.

$$\frac{\partial P(t_1, t_2)}{t_1} = 0 \tag{16}$$

$$\frac{\partial P(t_1, t_2)}{t_2} = 0 \tag{17}$$

Actually equations (3), (16), (17) should be compromised with each other in the adjustment of rise time and fall time. But the optimum decision should depend on iterated computer simulation results.

Figure 6A:
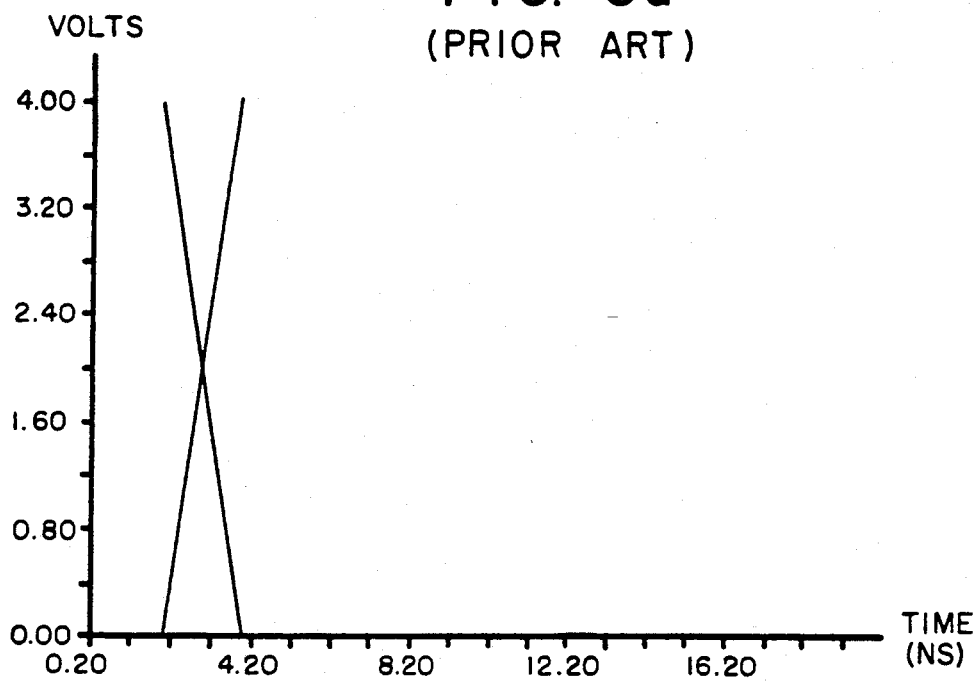
Figure 6B:
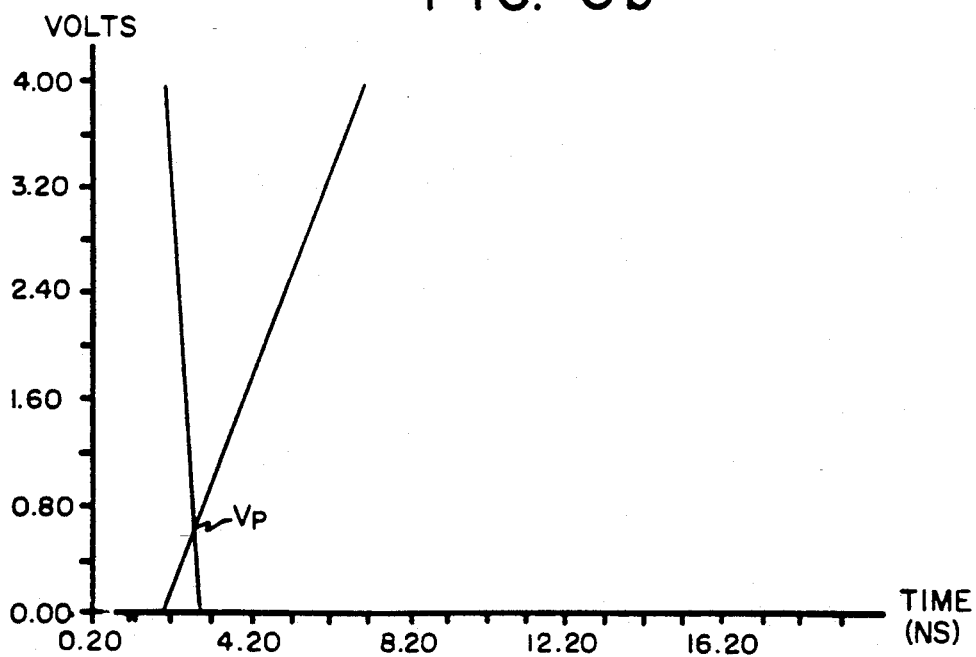

FIGS. 6a through 6d show the results obtained from simulating the operation of the cited prior art and the present invention. FIG. 6a illustrates the voltage output of the buffer circuit of the prior art. The crossing point voltage of the buffer output is usually set at 2.5 volts read from the Y-axis. FIG. 6b shows the voltage output of the buffer circuit with this invention. The crossing point voltage of the buffer output is set at quite a low voltage level of about 0.6 V read from the Y-axis. FIG. 6c illustrates the spike voltage at the node 20 of FIG. 1. It must be kept as small as possible to get a faster switching speed. The curves 21, 22 are the simulation results using the prior art and this invention, respectively. It is obvious that the spike represented by the curve 21 is much larger than the curve 22. FIG. 6d illustrates the current source output waveform when the loading is set at 37.5 ohms. The curve 32 which presents this invention settles at a much faster speed than the prior art buffer circuit the settling speed of which is shown by the curve 31.

While this invention has been particularly shown and described herein with reference to preferred embodiments, it will be understood by those skilled in that art that various modifications, additions, or substitutions may be made without departing form the principle of the invention as herein described and without departing from the spirit and scope as encompassed in the accompanying claims. Therefore, it is intended in the appended claims to cover all equivalent variations which may come within the scope of the invention as described.

What is claimed is:

1. A switching circuit for receiving differential input signals and transmitting output signals to respective output terminals in response thereto comprising:
   current steering switch means comprising two MOS transistors, each having a source terminal, the source terminals of both said transistors being connected to define a current input node, a drain terminal, each drain terminal of said transistors being connected to a respective one of said output terminals, and a gate terminal;
   current source means connected to said current input node;

means defining a power supply node for connection to a power supply and a ground node corresponding to circuit ground;

a pair of buffer means for generating control signals, each of said control signals is being conveyed to respective one of said gate terminals of said MOS transistors for controlling said respective one of said MOS transistors, each buffer means including a pull-up MOS transistor having a drain terminal connected to said power supply node and a source terminal, and a pull-down MOS transistor having a source terminal connected to said ground node and a drain terminal directly connected to the source terminal of said pull-up MOS transistor, the pull-up and pull-down transistors being of the same conductivity type, each of the differential input signals being coupled to and controlling the gate of the pull-up MOS transistor of one said buffer means and the gate of the pull-down MOS transistor of the other of said buffer means, the control signals generated by said buffer means having a fast fall time and slow rise time.

2. A switching circuit for receiving differential input signals and transmitting output signals to respective output terminals in response thereto comprising:

current steering switch means comprising two MOS transistors, each having a source terminal, the source terminals of both said transistors being connected to define a current input node, a drain terminal, the drain terminals of said transistors each being connected to a respective one of said output terminal, and a gate terminal;

current means connected to said current input node;

means defining a power supply node for connection to a power supply, and a ground node corresponding to circuit ground;

a pair of buffer means for generating control signals each of said control signals is being conveyed to respective one of said gate terminals of said MOS transistors for controlling said respective one of said MOS transistors, each buffer means including a pull-up MOS transistor of a first conductivity type having a drain terminal connected to said power supply node and a source terminals, and a pull-down MOS transistor of a conductivity type opposite to the pull-up transistor having a source terminal connected to ground node and a drain terminal directly connected to the source terminal of said pull-up MOS transistor, each of the differential input signals being coupled to controlling the gate terminals of both the pull-up MOS transistor and the pull-down MOS transistor in each of said buffer means, the control signals generated by said buffer means having a fast fall time and slow rise time.

* * * * *